United States Patent
Gu et al.

(10) Patent No.: US 12,197,068 B2
(45) Date of Patent: Jan. 14, 2025

(54) DISPLAY SUBSTRATE AND MANUFACTURE METHOD THEREOF, DISPLAY PANEL AND DISPLAY MODULE

(71) Applicant: BOE TECHNOLOGY GROUP CO., LTD., Beijing (CN)

(72) Inventors: Renquan Gu, Beijing (CN); Libo Wang, Beijing (CN); Detian Meng, Beijing (CN); Feng Zhang, Beijing (CN); Shiyu Zhang, Beijing (CN); Yujie Liu, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 217 days.

(21) Appl. No.: 17/785,595

(22) PCT Filed: Aug. 16, 2021

(86) PCT No.: PCT/CN2021/112701
§ 371 (c)(1),
(2) Date: Jun. 15, 2022

(87) PCT Pub. No.: WO2022/048429
PCT Pub. Date: Mar. 10, 2022

(65) Prior Publication Data
US 2023/0025267 A1    Jan. 26, 2023

(30) Foreign Application Priority Data
Sep. 2, 2020   (CN) .......................... 202010909885.2

(51) Int. Cl.
*G02F 1/1335* (2006.01)
*G02F 1/1333* (2006.01)
(Continued)

(52) U.S. Cl.
CPC .. *G02F 1/133553* (2013.01); *G02F 1/133354* (2021.01); *G02F 1/134309* (2013.01);
(Continued)

(58) Field of Classification Search
CPC ......... G02F 1/133553; G02F 1/133354; G02F 1/134309; G02F 1/136286
See application file for complete search history.

(56) References Cited

U.S. PATENT DOCUMENTS 5,349,503 A  *  9/1994  Blonder ............ G02F 1/133553
                                          359/530
5,926,242 A       7/1999  Kataoka et al.
(Continued)

FOREIGN PATENT DOCUMENTS

CN   1175048 A   3/1998
CN   1315011 A   9/2001
(Continued)

OTHER PUBLICATIONS

Machine translation of Akihiko et al (JP 2005300788) (Year: 2005).*

(Continued)

*Primary Examiner* — Lucy P Chien
(74) *Attorney, Agent, or Firm* — HOUTTEMAN LAW LLC

(57) ABSTRACT

An embodiment of the present disclosure provides a display substrate. The display substrate includes a driver backplane, and a reflective structure and a pixel electrode on the driver backplane. Reflective structure and the pixel electrode are disposed sequentially away from the driver backplane along a thickness direction of the driver backplane. The pixel electrode is connected to the driver backplane through the reflective structure. A surface of the reflective structure away from the driver backplane is a reflective surface comprising (Continued)

a plurality of arc surfaces, and each of the plurality of arc surfaces is convex protruding towards a direction away from the driver backplane. The plurality of the arc surfaces are continuously arranged, and any two adjacent arc surfaces of the plurality of the arc surfaces are connected to each other.

17 Claims, 7 Drawing Sheets

(51) Int. Cl.
    *G02F 1/1343*     (2006.01)
    *G02F 1/1362*     (2006.01)
    *G02F 1/1368*     (2006.01)
    *G03F 7/00*     (2006.01)

(52) U.S. Cl.
    CPC ...... *G02F 1/136286* (2013.01); *G03F 7/0007* (2013.01); *G02F 1/133357* (2021.01); *G02F 1/1368* (2013.01); *G02F 2203/02* (2013.01)

(56) References Cited

U.S. PATENT DOCUMENTS

| | | | |
|---|---|---|---|
| 6,501,522 | B2 | 12/2002 | Chang et al. |
| 7,760,321 | B2 | 7/2010 | Han et al. |
| 8,049,846 | B2 | 11/2011 | Fujiwara et al. |
| 10,437,105 | B2 | 10/2019 | Son et al. |
| 10,976,598 | B2 | 4/2021 | Fu et al. |
| 11,086,163 | B2 | 8/2021 | Wu et al. |
| 2003/0142247 | A1 | 7/2003 | Nishiyama et al. |
| 2008/0199638 | A1 | 8/2008 | Lin et al. |
| 2011/0141548 | A1 | 6/2011 | Yang et al. |
| 2017/0261793 | A1 | 9/2017 | Son et al. |
| 2019/0056548 | A1* | 2/2019 | Meng .................. G02B 6/0036 |

FOREIGN PATENT DOCUMENTS

| | | |
|---|---|---|
| CN | 1480772 A | 3/2004 |
| CN | 1828381 A | 9/2006 |
| CN | 101051140 A | 10/2007 |
| CN | 101131539 A | 2/2008 |
| CN | 101937156 A | 1/2011 |
| CN | 107102470 A | 8/2017 |
| CN | 107179624 A | 9/2017 |
| CN | 109799642 A | 5/2019 |
| CN | 111929944 A | 11/2020 |
| JP | H10111509 A | 4/1998 |
| JP | 2000162625 A | 6/2000 |
| JP | 2005300788 A | 10/2005 |
| KR | 1020050047880 A | 5/2005 |
| TW | I225556 B | 12/2004 |

OTHER PUBLICATIONS

China Patent Office, First Office Action dated Mar. 22, 2022, for corresponding Chinese application 202010909885.2.
China Patent Office, Rejection Office Action dated Sep. 5, 2022, for corresponding Chinese application 202010909885.2.

* cited by examiner

DISPLAY SUBSTRATE AND MANUFACTURE METHOD THEREOF, DISPLAY PANEL AND DISPLAY MODULE

TECHNICAL FIELD

The present disclosure relates to the field of display technology, and in particular, to a display substrate and a manufacture method thereof, a display panel and a display module.

BACKGROUND

Compared with a transmission liquid crystal display (LCD), a reflective LCD is a display technology which best meets the requirement of the era of the internet of things due to its advantages such as energy conservation, eye protection and the like, and is hugely required particularly on electronic tags, wearable displays and education flat displays. The reflective LCD has great market potential in the fields of electronic tags, wearable displays, flat panel displays, outdoor advertisements and the like due to its advantages such as low power consumption, low cost, color display, high response speed (e.g., less than 16.7 ms) and the like. However, at current, the reflective LCD has problems, for example, insufficient reflectivity, small viewing angle, poor contrast ratio, and low front luminance.

SUMMARY

Embodiments of the present disclosure provide a display substrate and a manufacture method thereof, a display panel and a display module.

As a first aspect, an embodiment of the present disclosure provides a display substrate including a driver backplane, and a reflective structure and a pixel electrode on the driver backplane. The reflective structure and the pixel electrode are sequentially disposed on the driver backplane along a thickness direction away from the driver backplane. The pixel electrode is connected to the driver backplane through the reflective structure. A surface of the reflective structure away from the driver backplane is a reflective surface comprising a plurality of arc surfaces, and each of the plurality of arc surfaces is convex protruding towards a direction away from the driver backplane, the plurality of the arc surfaces are continuously arranged, and any two adjacent arc surfaces of the plurality of the arc surfaces are connected to each other.

In some embodiments, each of the plurality of arc surfaces includes: a first sub-portion, and a second bus-portion surrounding the first sub-portion and connected to the first sub-portion. The first sub-portion is a portion of a spherical surface, a pitch between vertexes of the first sub-portions of the any two adjacent arc surfaces is smaller than a diameter of the spherical surface where the first sub-portion is located, and the second sub-portions of any two adjacent arc surfaces are connected to each other. The vertex of the first sub-portion is a vertex of the arc surface.

In some embodiments, the second sub-portions of any two adjacent arc surfaces are spliced to form a concave arc surface protruding along a direction opposite to a convex direction of the first sub-portion.

In some embodiments, the plurality of arc surfaces are arranged in an array.

In some embodiments, the plurality of arc surfaces have a same size, and an orthographic projection of each of the plurality of arc surfaces on the base substrate has a shape of a circle.

In some embodiments, the plurality of arc surfaces are continuously arranged along first and second straight-line directions different from each other, and the vertexes of any two adjacent arc surfaces along the first straight-line direction are staggered along the second straight-line direction from each other by ¼ to ⅔ of a first distance, the first distance being a pitch between vertexes of any two adjacent arc surfaces along the first and second straight-line directions.

In some embodiments, the pitch between the vertexes of any two adjacent arc surfaces is greater than 0m and less than or equal to 10 μm.

In some embodiments, a proportion of the pitch between vertexes of the first sub-portions of the two adjacent arc surfaces to a curvature radius of the first sub-portion is in a range of 0.9:1 to 1.6:1.

In some embodiments, the reflective structure includes a first sub-layer and a second sub-layer stacked sequentially in a direction away from the driver backplane, and a surface of the second sub-layer away from the first sub-layer is the reflective surface, and a surface of the first sub-layer in contact with the second sub-layer matches the second sub-layer in size and shape.

In some embodiments, the first sub-layer is made of a resin material, and the second sub-layer is made of a reflective metal material.

In some embodiments, the driver backplane includes a base substrate and a transistor on a side of the base substrate proximal to the reflective structure; the transistor comprises a gate electrode, an active layer, a first electrode and a second electrode; and a first via-hole is in the reflective structure. The display substrate further includes a planarization layer on a side of the reflective structure away from the driver backplane, and the planarization layer is on a side of the pixel electrode proximal to the driver backplane, a surface of the planarization layer away from the driver backplane is a planarized surface. A second via-hole is in the planarization layer, an orthographic projection of the second via-hole on the base substrate is spaced apart from an orthographic projection of the first via-hole on the base substrate, and the pixel electrode is connected to the second electrode through both of the second via-hole and the reflective structure.

In some embodiments, the display substrate includes a plurality of pixel electrodes arranged in an array, wherein the second sub-layer includes a plurality of sub-portions independent of each other and in one-to-one correspondence with the plurality of pixel electrodes, and both of orthographic projections of the first via-hole and the second via-hole on the base substrate are within an orthographic projection of a corresponding one of the plurality of pixel electrodes on the base substrate.

In some embodiments, each of the plurality of sub-portions includes a first region and a second region independent of each other, and both of the orthographic projections of the first via-hole and the second via-hole on the base substrate are within an orthographic projection of a corresponding first region on the base substrate.

In some embodiments, the display substrate further includes a plurality of gate lines, a plurality of data lines, and a plurality of storage electrodes, wherein the plurality of gate lines are in the same layer as the gate electrode and each of the plurality of gate lines is connected to a corresponding gate electrode, the plurality of data lines are in the same layer as the first electrode, and each of the plurality of data lines is connected to a corresponding first electrode, and each of the plurality of storage electrodes includes a first electrode plate and a second electrode plate facing the first electrode plate, the first electrode plate is in the same layer as the first electrode, and the second electrode plate is in the same layer as the gate electrode.

In some embodiments, each column of pixel electrodes correspond to n data lines of the plurality of data lines, n is a positive integer more than or equal to 2, and each pixel electrode of each column of pixel electrodes corresponds to different gate lines.

As a second aspect, an embodiment of the present disclosure provides a display panel, including above display substrate and a counter substrate aligned with the display substrate to form a cell, with a liquid crystal layer between the display substrate and the counter substrate.

As a third aspect, an embodiment of the present disclosure provides a display module, including above display panel and a light source on a light-emitting side of the display panel, wherein a light-emitting surface of the light source faces the light-emitting side of the display panel.

As a fourth aspect, an embodiment of the present disclosure provides a method for manufacturing a display substrate, including: forming a driver backplane; and sequentially forming a reflective structure and a pixel electrode on the driver backplane, such that the reflective structure and the pixel electrode are sequentially disposed on the driver backplane along a thickness direction away from the driver backplane and the pixel electrode is connected to the driver backplane through the reflective structure. Forming the reflective structure includes forming a reflective surface, and forming the reflective surface includes forming a plurality of arcs surfaces protruding along a direction away from the driving backplane, such that the plurality of arc surfaces are continuously arranged and any two adjacent arc surfaces of the plurality of arc surfaces are connected to each other.

In some embodiments, forming the reflective structure includes: sequentially forming a first sub-layer and a second sub-layer on the driver backplane, with a surface of the second sub-layer away from the first sub-layer serving as the reflective surface. Forming the first sub-layer includes: coating a resin material layer; respectively forming a first pattern and a pattern of a first via-hole by performing exposure and development processes on the resin material layer by using a mask plate with a first light-transmitting pattern and a second light-transmitting pattern, and reflowing the first pattern at a temperature of 230° C. to 250° C. to form the plurality of arc surfaces. Forming the second sub-layer includes: depositing a reflective metal layer on the first sub-layer.

In some embodiments, the first pattern has a shape of a square, a circle, a regular hexagon, or a regular octagon.

BRIEF DESCRIPTION OF DRAWINGS

The accompanying drawings, which are provided for further understanding of the present disclosure and constitute a part of this specification, are for explaining the present disclosure together with the following exemplary embodiments, but are not intended to limit the present disclosure. The above and other features and advantages will be more apparent to those skilled in the art by describing detailed example embodiments with reference to the accompanying drawings. In the drawings.

DETAIL DESCRIPTION OF EMBODIMENTS

Figure 1:
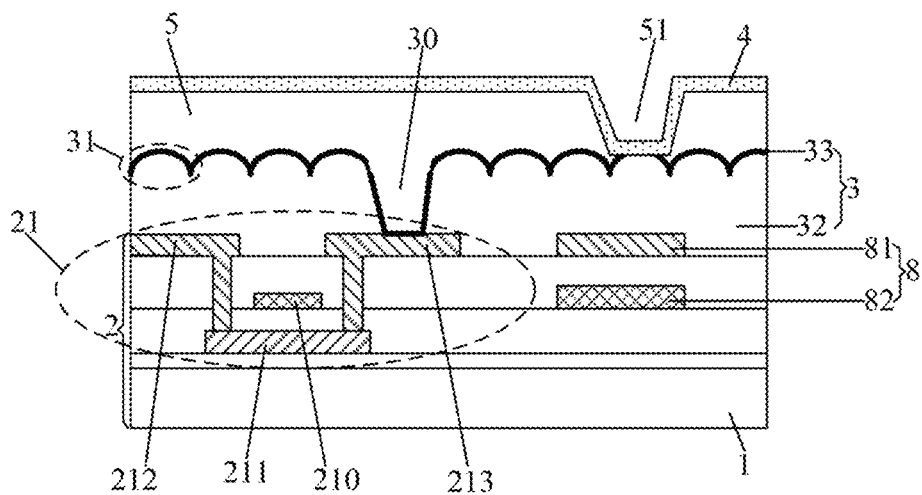
FIG. 1 is a schematic cross-sectional view showing a local structure of a display substrate according to an embodiment of the present disclosure.

In order to make those skilled in the art better understand the technical solutions of the embodiments of the present disclosure, a display substrate and a manufacture method thereof, a display panel, and a display module will be described in further detail with reference to the accompanying drawings and specific embodiments of the present disclosure.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the present disclosure to those skilled in the art.

Embodiments of the present disclosure are not limited to the embodiments shown in the drawings, but include modifications of configurations formed based on manufacturing processes. Accordingly, the regions in the drawings are schematic, and the shapes of the regions shown in the drawings show specific shapes of the regions and are not intended to be limited thereto.

In reflective liquid crystal displays (i.e., LCDs), a reflective layer is generally formed in an array substrate. The array substrate and a color filter substrate are aligned to form a cell, and a liquid crystal layer is disposed between the array substrate and the color filter substrate to form a liquid crystal display panel. In order to avoid poor display caused by insufficient light of an external environment, a light source may be disposed on a side of the color filter substrate away from the array substrate. Light emitted from the light source irradiates the array substrate, is reflected by the reflective layer, passes through the color filter substrate, and exits to a display side of the liquid crystal display panel. Such a light source is referred to as a front light source.

The reflective layer can be formed as a continuous convex structure that is developed with the goal of a Lambertian-like reflective structure. The Lambertian body refers to a phenomenon that incident energy is uniformly reflected in all directions, that is, the incident energy is reflected isotropically over the entire hemispherical space with an incident point as a center of the hemispherical space, which is called diffuse reflection or isotropic reflection, and the entire diffuser is called the Lambertian body. The light reflected by the Lambertian reflective structure has good brightness uniformity, good contrast ratio, and wide range of emitted light. If the reflective layer is formed into an ideal Lambertian-like reflective structure, the brightness uniformity, the contrast ratio and the viewing angle range of the reflective liquid crystal display panel can be improved.

Aiming at the problems of insufficient reflectivity, small viewing angle, poor contrast ratio, and low front brightness of the existing reflective LCD, the present disclosure focus on developing a Lambertian-like reflective structure that can improve viewing angle, brightness uniformity and contrast ratio.

Figure 2:
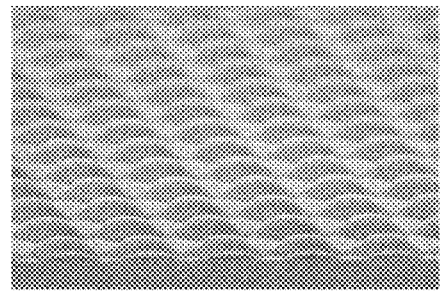
FIG. 2 is an electron micrograph showing a reflective surface of a reflective structure in a display substrate according to an embodiment of the present disclosure.

Aiming at the problems of insufficient reflectivity, small viewing angle, poor contrast ratio and low front brightness of the existing reflective LCD, an embodiment of the present disclosure provides a display substrate. As shown in FIG. 1 and FIG. 2, the display substrate includes a driver backplane 2, a reflective structure 3 and a pixel electrode 4 on the driver backplane 2. The reflective structure 3 and the pixel electrode 4 are sequentially disposed away from the driver backplane 2 along a thickness direction of the driver backplane 2; the pixel electrode 4 is connected to the driver backplane 2 through the reflective structure 3; the surface of the reflective structure 3 away from the driver backplane 2 is a reflective surface. The reflective surface includes a plurality of arc surfaces 31 each of which is convex towards a direction away from the driver backplane 2. The plurality of arc surfaces 31 are continuously arranged, and any two adjacent arc surfaces 31 are connected to each other.

The driver backplane 2 includes a base substrate 1 and a transistor 21 on a side of the base substrate 1 proximal to the reflective structure 3. The transistor 21 includes a gate electrode 210, an active layer 211, a first electrode 212 and a second electrode 213. A first via-hole 30 is formed in the reflective structure 3, and the pixel electrode 4 is connected to the second electrode 213 through the first via-hole 30. The first electrode 212 and the second electrode 213 are respectively disposed at two ends of the active layer 211 and both connected to the active layer 211. When the transistor 21 is turned on, the first electrode 212 and the second electrode 213 are electrically connected to each other; and when the transistor 21 is turned off, the first electrode 212 is electrically disconnected from the second electrode 213.

It should be noted that, the arc surfaces 31 being continuously arranged means that any two adjacent arc surfaces 31 can be directly connected to each other to form a non-arc surface connection surface as shown in FIG. 1. Or alternatively in an actual process, concave arc surfaces as shown in FIG. 2 are formed in regions between any two adjacent arc surfaces 31 of the arc surfaces 31 continuously arranged.

Figure 3:
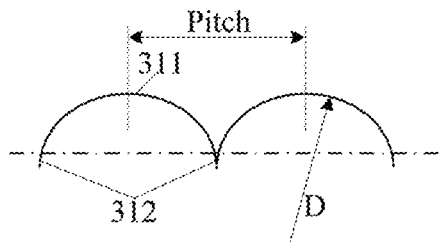
FIG. 3 is a schematic cross-sectional view showing a structure of an arc surface in a display substrate according to an embodiment of the present disclosure.

Optionally, as shown in FIG. 3, the arc surface 31 includes a first sub-portion 311 and a second sub-portion 312 surrounding the first sub-portion 311. The first sub-portion 311 is connected to the second sub-portion 312. The first sub-portion 311 is a part of a sphere. A pitch between vertexes of the first sub-portions 311 of any two adjacent arc surfaces 31 is smaller than a diameter D of the sphere or the spherical surface where the first sub-portion 311 is located. The second sub-portions 312 of any two adjacent arc surfaces 31 are connected to each other. The vertex of the first sub-portion 311 is the vertex of the arc surface 31.

Optionally, the second sub-portions 312 of any two adjacent arc surfaces 31 are spliced together to form a concave arc surface protruding along a direction opposite to the convex direction of the first sub-portion 311. The concave arc surface is formed in the actual process.

Optionally, the arc surfaces 31 are arranged in an array.

In an embodiment, the display substrate and the counter substrate are aligned to form a cell with a liquid crystal layer disposed therebetween, so as to form a liquid crystal display panel. A light source is located on a side of the counter substrate away from the display substrate. During the display process, light emitted by the light source (i.e., the front light source) irradiates towards the display substrate, is reflected by the reflective surface of the reflective structure 3, and emits through the counter substrate towards to the display side, so that display of the display panel can be realized.

Figure 4:
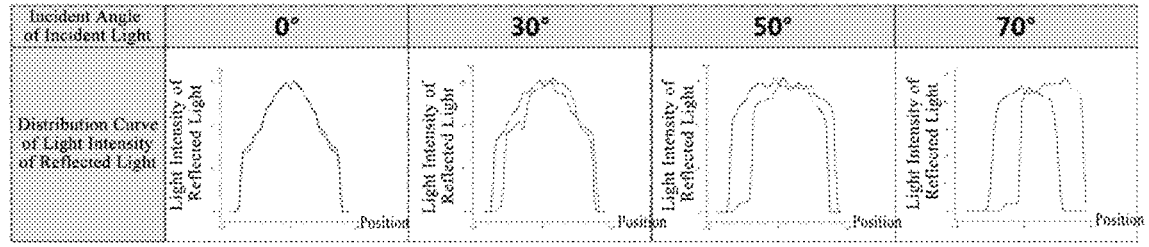
FIG. 4 is a schematic diagram showing a distribution curve of light intensity of reflected light when incident light is incident on a reflective surface of a reflective structure with various incident angles according to an embodiment of the present disclosure.

Since the continuously arranged arc surfaces 31 serve as the reflective surface, the reflective structure 3 can make the distribution curve of the light intensity of the light reflected by the reflective surface when the incident light with various incident angles is incident on the reflective surface approach a cosine function, with an incident angle of the incident light being an included angle between the incident light and a normal line of the display substrate. That is, the distribution curve of the light intensity of the light reflected when the incident light with various incident angles is incident on the reflective surface presents a normal distribution, as shown in FIG. 4, which is substantially consistent with the Lambertian reflective curve, so that the reflective structure 3 can be formed as the Lambertian-like reflective structure. The Lambertian-like reflective structure can realize that the light intensity of the diffused light along various directions is always proportional to the cosine function of the incident angle regardless of the direction of the incident light, so that the light from various directions has the same luminance, and thus, not only the brightness uniformity and the contrast ratio of the display panel including the display substrate can be improved, but also the viewing angle and the display effect of display panel including the display substrate can be improved because the incident light in various directions, after passing through the reflective surface, can form diffuse reflective light along a direction perpendicular to a plane where tangent lines on the arc surfaces are located. The reflected light in FIG. 4 has two distribution curves of the light intensity, one of which is a distribution curve of the light intensity of the reflected light in a direction perpendicular to the plane of the display substrate, and the other is a distribution curve of the light intensity of the reflected light in a direction parallel to the plane of the display substrate. An X-coordinate of the distribution curve of the light intensity of the reflected light in FIG. 4 represents coordinates for position points of the display panel along a span direction of the viewing angle (i.e., a direction parallel to a straight line where pupils of both eyes of a viewer are located when the viewer normally views the display panel).

Figure 5:
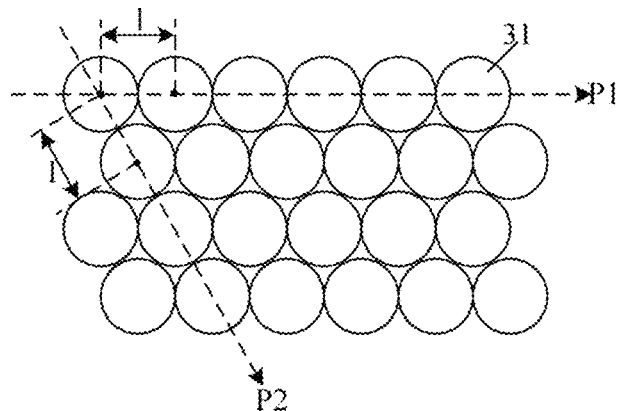
FIG. 5 is a schematic top view showing an arrangement of arc surfaces of a display substrate according to an embodiment of the present disclosure.

Optionally, as shown in FIG. 5, the arc surfaces 31 has the same size, and an orthographic projection of each of the arc surfaces 31 on the base substrate has a shape of a circle.

Further optionally, as shown in FIG. 5, the plurality of arc surfaces 31 may be continuously arranged along any two different directions, that is, a first straight-line direction P1 and a second straight-line direction P2. A pitch between vertexes of any two adjacent arc surfaces 31 along the first straight-line direction P1 and along the second straight-line direction P2 is a first distance 1. The vertexes of any two adjacent arc surfaces 31 along the first straight-line direction P1 are spaced apart from each other along the second straight-line direction P2 by ¼ to ⅔ of the first distance 1. A vertex of the arc surface 31 is the highest point of the arc surface, that is, the point on the arc surface which is farthest from the base substrate 1 in the direction perpendicular to the base substrate 1. With the arrangement, continuous tight connection between the arc surfaces 31 can be ensured, so that a better Lambertian-like reflective structure can be formed, and the viewing angle, the brightness uniformity and the contrast ratio of the display panel including the display substrate can be further improved.

Figure 6:
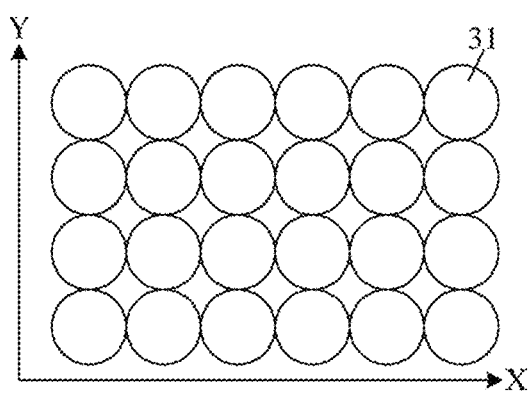
FIG. 6 is a schematic top view showing another arrangement of arc surfaces of a display substrate according to an embodiment of the present disclosure.

It should be noted that, as shown in FIG. 6, a plurality of arc surfaces may also be continuously arranged in an array. Along the row direction X of the array, any two adjacent rows of arc surfaces 31 may also be aligned in one-to-one correspondence manner, respectively; and along the column direction Y of the array, any two adjacent columns of arc surfaces 31 can also be aligned in one-to-one correspondence manner, respectively. With such an arrangement, although the continuity between the arc surfaces 31 is inferior to that in the above arrangement, the Lambertian-like reflective structure can also be formed to some extent, thereby improving the viewing angle, the brightness uniformity, and the contrast ratio of the display panel using the display substrate.

Optionally, the pitch between the vertexes of the adjacent arc surfaces 31 is greater than 0 μm and less than or equal to 10 μm. With such pitch, a better Lambertian-like reflective structure can be formed, thereby being beneficial to the uniformity of the display brightness of the display substrate at various viewing angles.

Figure 7:
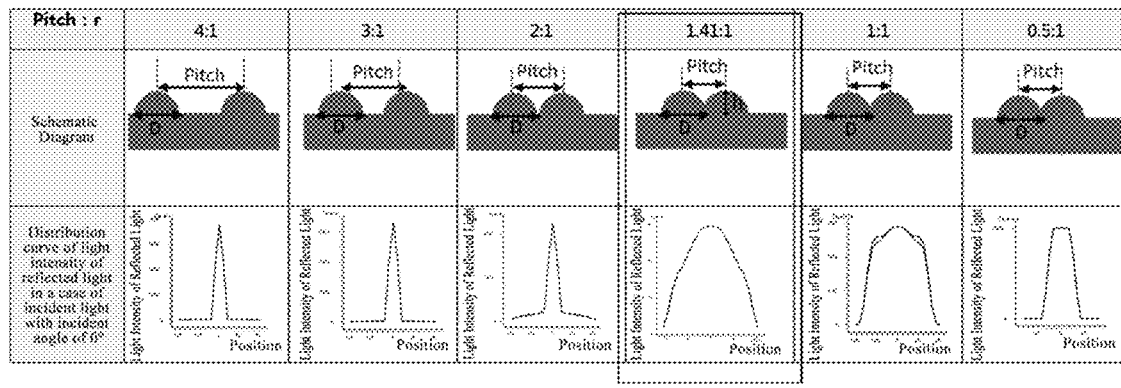
FIG. 7 is a distribution curve of the light intensity of reflected light when an incident light with the incident angle of 0° is incident on the reflective surface of the reflective structure in a case of various proportions of a pitch between vertexes of adjacent arc surfaces to a curvature radius of the arc surfaces.

Optionally, a proportion of the pitch between the vertexes of the first sub-portions of the adjacent arc surfaces 31 to the curvature radius of the first sub-portion ranges from 0.9:1 to 1.6:1. Preferably, the optimum proportion of the pitch between the vertexes of the first sub-portions of the adjacent arc surfaces 31 to the curvature radius of the first sub-portion is 1.41:1. The curvature radius of the first sub-portion is a radius of the spherical surface. FIG. 7 shows, with experiments, the distribution curve of the light intensity of the light reflected when the incident light with the incident angle of 0° is incident on the reflective surface of the reflective structure 3 in a case where the pitch between the vertexes of the first sub-portions of the adjacent arc surfaces 31 to the curvature radius r of the first sub-portion has various ratios. There are two distribution curves of the light intensity of the reflected light, one of which is a distribution curve of the light intensity of the reflected light perpendicular to the plane where the display substrate is located, and the other is a distribution curve of the light intensity of the reflected light parallel to the plane where the display substrate is located. As can be seen from FIG. 7, when the proportion of the pitch between the vertexes of the first sub-portions of the adjacent arc surfaces 31 to the curvature radius r of the first sub-portion is 1.41:1, the distribution curve of the light intensity of the light reflected when the incident light with the incident angle of 0° is incident on the reflective surface of the reflective structure 3 approximates a cosine function, that is, the distribution curve of the light intensity of the light reflected when the incident light with the incident angle of 0° is incident on the reflective surface of the reflective structure 3 presents a normal distribution, with the incident angle of the incident light being an included angle between the incident light and a normal line of the display substrate. The distribution curve of the light intensity of the light reflected is substantially consistent with the Lambertian reflective curve. Therefore, the reflective structure 3 can be formed as the Lambertian-like reflective structure. The Lambertian-like reflective structure can realize that the light intensity of the diffused light along various directions is always proportional to the cosine function of the incident angle regardless of the direction of the incident light. Therefore, the lights from various directions has the same luminance, and thus not only the brightness uniformity and the contrast ratio of the display panel including the display substrate can be improved, but also the viewing angle of the display panel including the display substrate can be improved.

Optionally, an opening caliber D of the arc surface 31 is greater than or equal to 2 μm and less than or equal to 20 μm. An arch height h of the arc surface 31 is greater than 0 m and less than or equal to 3 μm. The arch height h of the arc surface 31 and the opening caliber D of the arc surface 31 can be calculated according to the pitch between the vertexes of the adjacent arc surfaces 31 and the proportion of the pitch between the vertexes of the adjacent arc surfaces 31 to the curvature radius of the arc surface 31. For example, when the arc surface 31 is a hemispherical surface, D=1.41 Pitch; h=r. As shown in FIG. 7, the opening caliber D of the arc surface 31 is a maximum size of an opening of the arc surface 31, the opening of the arc surface 31 is on a side of the arc surface 31 proximal to the base substrate 1, and an arch height h of the arc surface 31 is a shortest distance from a vertex (i.e., a highest point) of the arc surface 31 to a plane where the opening is located.

Figure 8:
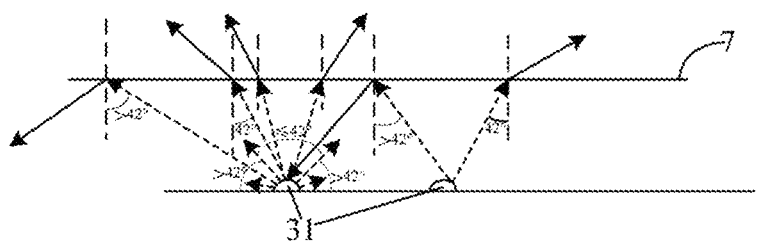
FIG. 8 is a schematic diagram showing that light irradiated to a reflective surface of a reflective structure is reflected and then emitted to an air interface according to an embodiment of the present disclosure.
Figure 9:
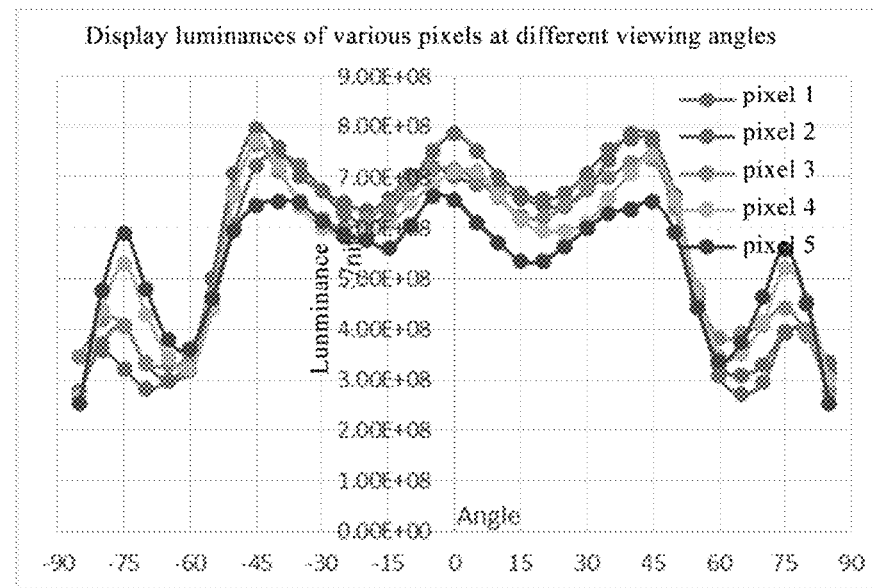
FIG. 9 is a graph of display luminance of various pixels at various viewing angles in a range from 90° on the left to 90° on the right for the display substrate of the display panel according to an embodiment of the present disclosure.

As shown in FIG. 8, with the reflective surface in the embodiment, when light emitted from the front light source is incident on the reflective surface, incident light with an incident angle of 42° or less can reach the air interface 7 (i.e., the surface on the display side of the display panel) and exit out. The incident light with the incident angle larger than 42° may be totally reflected by the reflective surface; the incident light with the incident angle larger than 42° may be scattered by the reflective surface and finally become small-angle light which can reach the air interface 7 and emit out, so that light loss can be prevented, and the display brightness of the display panel adopting the display substrate can be improved. FIG. 9 shows display luminances of various pixels at different viewing angles in a range from 90° on the left to 90° on the right, when a certain light (i.e. an incident light in a certain direction) emitted from a light source is incident on the display substrate of the display panel. As can be seen from FIG. 9, with the reflective surface of the reflective structure 3, the display brightness at different viewing angles of various pixels at different positions can be is basically the same, and thus not only the brightness uniformity and the contrast ratio of the display panel including the display substrate can be improved, but also the viewing angle of display panel including the display substrate can be improved.

Optionally, as shown in FIG. 1, the reflective structure 3 includes a first sub-layer 32 and a second sub-layer 33. The first sub-layer 32 and the second sub-layer 33 are stacked sequentially along a direction away from the driver backplane 2. The surface of the second sub-layer 33 away from the first sub-layer 32 is a reflective surface. The surface of the first sub-layer 32 in contact with the second sub-layer 33 matches the second sub-layer 33 in size and shape.

Optionally, the first sub-layer 32 is made of resin material; the second sub-layer 33 is made of a reflective metal material, for example, indium tin oxide, a stack layer of silver and indium tin oxide, or an aluminum neodymium alloy. The material of the first sub-layer 32 enables the reflective surface of the reflective structure 3 is formed through common exposure process, development process and high-temperature reflow process without relatively complex processes such as a semi-mask process, so that the manufacture cost and the process difficulty can be reduced. The material of the second sub-layer 33 can promote good reflection of light, which is beneficial for better reflective display.

Optionally, the display substrate further includes a planarization layer 5. The planarization layer 5 is on a side of the reflective structure 3 away from the driver backplane 2 and on a side of the pixel electrode 4 proximal to the driver backplane 2. The surface of the planarization layer 5 away from the driver backplane 2 is a planarized surface. A second via-hole 51 is formed in the planarization layer 5. An orthographic projection of the second via-hole 51 on the base substrate 1 is spaced apart or offset from an orthographic projection of the first via-hole 30 on the base substrate 1. The pixel electrode 4 is connected to the second electrode 213 through the second via-hole 51 and the reflective structure 3. The planarization layer 5 is made of transparent resin material, so that the light from the front light source can be irradiated the reflective surface of the reflective structure 3 after the light passes through the planarization layer for realizing reflective display.

Optionally, in FIG. 1, the display substrate further includes a gate line, a data line, and a storage electrode 8. The gate line and the gate electrode 210 are disposed in the same layer, and the gate line is connected to the gate electrode 210. A signal for controlling the transistor 21 to be turned on is input to the gate electrode 210 through the gate line. The data line and the first electrode 212 are disposed in the same layer, and the data line is connected to the first electrode 212. A data signal is provided to the pixel electrodes 4 through the data line. The storage electrode 8 includes a first electrode plate 81 and a second electrode plate 82 opposite to each other. The first electrode plate 81 is disposed in the same layer as the first electrode plate 212, and the second electrode plate 82 is disposed in the same layer as the gate electrode 210. The transistor 21 controls the pixel electrode 4 to be turned on and off. A pixel voltage signal is input to the first electrode plate 81, and a common voltage signal is input to the second electrode plate 82. The first electrode plate 81 and the second electrode plate 82 of the storage electrode 8 form a storage capacitor for storing a charging voltage supplied to the pixel electrode 4 from the data line, so as to ensure that the voltage of the pixel electrode 4 can be held during display.

The liquid crystal alignment layer is formed on a side of the pixel electrode 4 away from the base substrate by performing rubbing and aligning processes on a coated liquid crystal alignment film. The reflective surface of the reflective structure 3 includes a plurality of arc surfaces 31, which causes the liquid crystal alignment film formed above the pixel electrode 4 to be uneven, that is, the surface of the liquid crystal alignment film may have a height different greatly at different positions. When the liquid crystal alignment layer is formed by rubbing the liquid crystal alignment film subsequently, the uneven surface of the liquid crystal alignment film causes poor rubbing and the light leakage phenomenon in the display. With the planarization layer 5, the reflective surface of the reflective structure 3 can be planarized, so that the light leakage phenomenon due to the liquid crystal alignment layer formed above the pixel electrode 4 subsequently can be avoided, and thus the light leakage of display can be further avoided. In addition, if the orthographic projection of the first via-hole 30 on base substrate 1 overlaps the orthographic projection of the second via-hole 51 on base substrate 1, that is, the first via-hole 30 and the second via-hole 51 are formed as a sleeve hole, which means that a position of the first via-hole 30 corresponds to a position of the second via-hole 51 and an orthographic projection of the first via-hole 30 on the base substrate 1 coincides with or overlaps an orthographic projection of the second via-hole 51 on the base substrate 1. After the display substrate and the counter substrate are aligned to form a cell, there is a cell gap of 5 µm to 6 µm at the via-holes, which results in that the cell thickness of the liquid crystal display panel at the via-holes is 5 µm to 6 µm much greater than the cell thickness of liquid crystal display panel at other positions except the sleeve hole, and in turn results in a delay in deflecting the liquid crystal by the electric field, and further results in the light leakage in the dark state. In the embodiment, since the first via-hole 30 is spaced apart from the second via-hole 51, the cell gap at the via-holes in the pixel can be decreased, for example, the cell gap at the via-holes can be decreased to 1.3 µm from 6 µm, and the risk of light leakage in the dark state can be reduced, and the yield rate of the display panel including the display substrate can be improved. Since the orthographic projection of the first via-hole 30 on the base substrate 1 does not overlap the orthographic projection of the second via-hole 51 on the base substrate 1, the difficulty of the manufacture process and manufacture yield of the display substrate can be improved.

Figure 10:
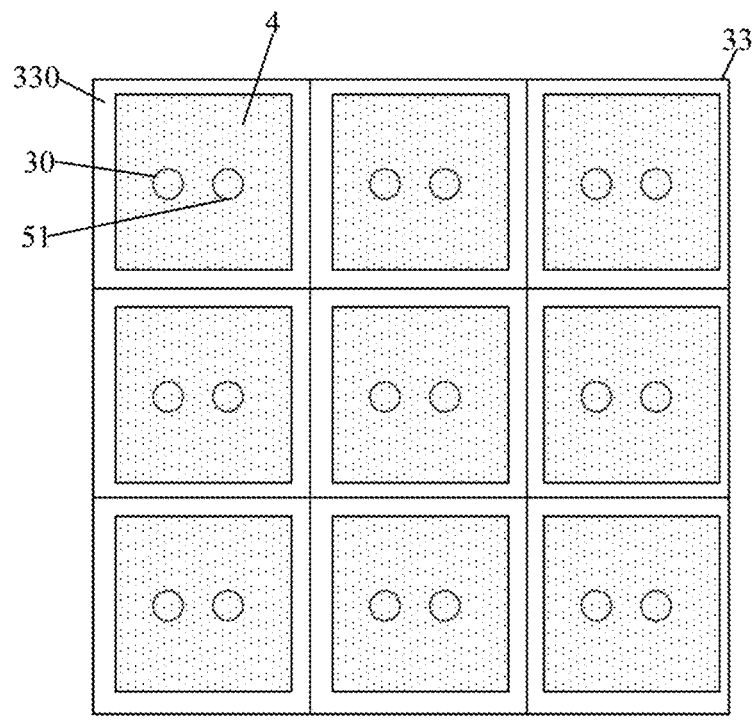
FIG. 10 is a schematic top view showing an arrangement of pixel electrodes and second sub-layers according to an embodiment of the present disclosure.

Optionally, as shown in FIG. 10, the display substrate includes a plurality of pixel electrodes 4 arranged in an array. The pixel electrodes 4 are made of a transparent electrode material (e.g., ITO), therefore the pixel electrodes 4 can transmit light. The second sub-layer 33 includes a plurality of sub-portions 330 independent of each other and in one-to-one correspondence with the plurality of pixel electrodes 4. Both of the orthographic projections of the first via-hole 30 and the second via-hole 51 on the base substrate 1 fall within the orthographic projection of a corresponding pixel electrode 4 on the base substrate 1. The plurality of sub-portions 330 are independent of each other, that is, the plurality of sub-portions 330 are insulated from each other. An area of the orthographic projection of each of the sub-portion 330 on the base substrate 1 may be larger than an area of the orthographic projection of a corresponding pixel electrode 4 on the base substrate 1, and the orthographic projection of the sub-portions 330 on the base substrate 1 covers the entire orthographic projection of the corresponding pixel electrode 4 on the base substrate 1. Alternatively, an area of the orthographic projection of each of the sub-portions 330 on the base substrate 1 may be equal to an area of the orthographic projection of a corresponding pixel electrode 4 on the base substrate 1, and the orthographic projection of the sub-portion 330 on the base substrate 1 coincides with the orthographic projection of the corresponding pixel electrode 4 on the base substrate 1. In short, as long as it is ensured that all the light from the front light source transmitted into the display substrate after passing through the pixel electrode 4 can be irradiated on the reflective surface of the reflective structure 3.

Figure 11:
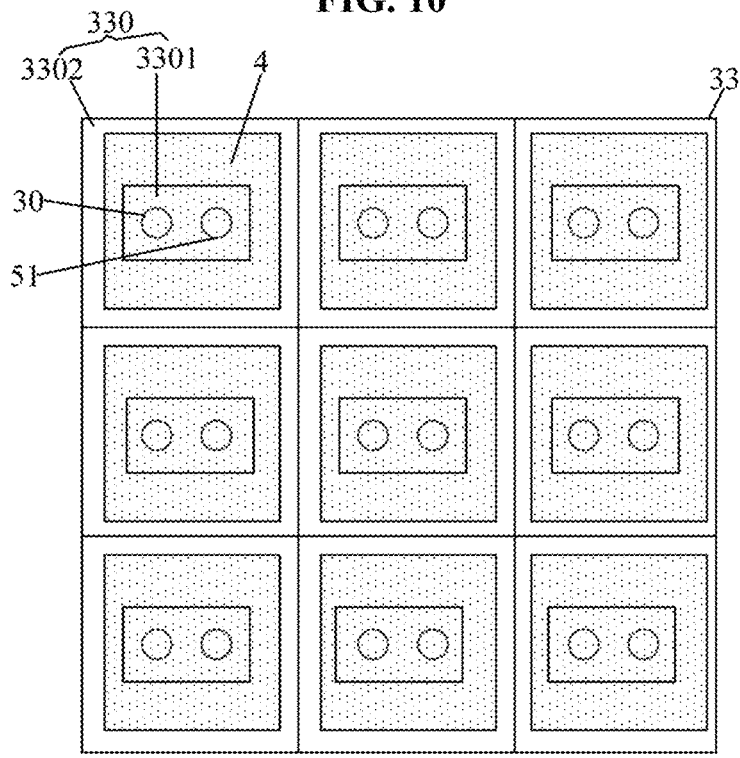
FIG. 11 is a schematic top view showing another arrangement of pixel electrodes and second sub-layers according to an embodiment of the present disclosure.

Further optionally, as shown in FIG. 11, each of the sub-portions 330 includes a first region 3301 and a second region 3302 independent of each other, that is, the first region 3301 and the second region 3302 are spaced apart, insulated, and disconnected from each other. The orthographic projections of the first via-hole 30 and the second via-hole 51 on the base substrate 1 fall within an orthographic projection of a corresponding first region 3301 on the base substrate 1. That is, the pixel electrode 4 is electrically connected to the second electrode of the transistor through the second via-hole 51, the first via-hole 30 and the first region 3301.

Figure 12:
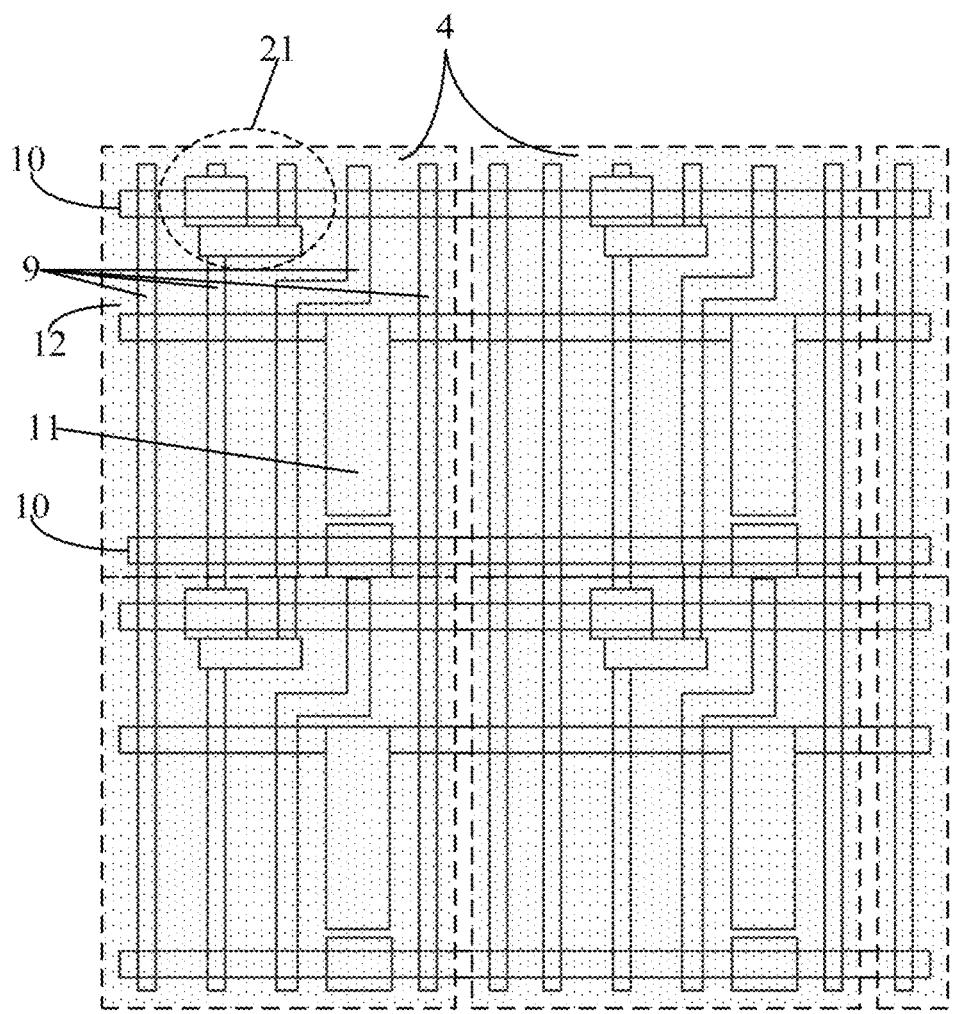
FIG. 12 is a schematic top view showing a structure of a display substrate according to an embodiment of the present disclosure.

Optionally, as shown in FIG. 12, all of the data lines 9 respectively connected to the pixel electrodes 4, the transistors 21 connected to the pixel electrodes 4, the gate lines 10 connected to the gate electrodes of the transistors 21, the common electrode lines 12 in parallel to and disposed in the same layer as the gate lines 10, and the storage capacitors 11 for storing the voltages of the pixel electrodes 4 in the display substrate are located within the orthographic projection of the pixel electrodes 4 on the base substrate 1. In the pixel region where the pixel electrode 4 is located, the reflective surface of the reflective structure realizes reflective display, therefore in the pixel region, the film layers below the reflective structure may not be required to transmit light, and the film layers cannot transmit light and wirings may all be arranged in the pixel region without affecting the normal display of the display substrate. Optionally, a column of pixel electrodes 4 may correspond to n data lines 9 (e.g., n is a positive integer greater than or equal to 2), and various pixel electrodes 4 in the column of pixel electrodes 4 correspond to different gate lines 10. During driving display, the same scanning signal may be input to the n gate lines 10, so that the n pixel electrodes 4 in the same column of pixel electrodes 4 may be charged simultaneously, therefore the refresh rate of the display panel can be effectively improved. FIG. 12 shows a case where a column of pixel electrodes 4 corresponds to four data lines 9. Specifically, for the same column of pixel electrodes 4, a first data line 9 may correspond to the $(1, 8, 9, \ldots, 8m,$ and $8 m+1)^{th}$ rows of pixel electrodes, a second data line 9 may correspond to the $(2, 7, 10, \ldots, 8 m-1,$ and $8 m+2)^{th}$ rows of pixel electrodes, a third data line 9 may correspond to the $(3, 6, 11, \ldots, 8 m-2,$ and $8 m+3)^{th}$ rows of pixel electrodes, and a fourth data line 9 may correspond to the $(4, 5, 12, \ldots, 8 m-3,$ and $8 m+4)^{th}$ rows of pixel electrodes, wherein m is an integer greater than or equal to zero. For example, by inputting the same scan signal to the $1^{st}$, $2^{nd}$, $3^{rd}$, and $4^{th}$ rows of gate lines 10, the pixel electrodes 4 in the $1^{st}$, $2^{nd}$, $3^{rd}$ and $4^{th}$ rows can be charged at the same time, thereby significantly increasing the refresh rate. Further, since the reflective display substrate does not need a backlight, the opaque metal signal lines may be disposed in the pixel region without affecting the influence on the aperture ratio of the pixels.

Based on the above structure of the display substrate, an embodiment further provides a method for manufacturing the display substrate, including forming a driver backplane; and forming a reflective structure and a pixel electrode on the driver backplane such that the reflective structure and the pixel electrode are sequentially disposed away from the driver backplane along a thickness direction of the driver backplane and the pixel electrode is connected to the driver backplane through the reflective structure. The formation of the reflective structure includes forming a reflective surface. The formation of the reflective surface includes forming a plurality of arc surfaces each of which protrudes towards a direction away from the driver backplane, such that the arc surfaces are continuously arranged and any two adjacent arc surfaces are connected to each other.

The formation of the reflective structure includes sequentially forming a first sub-layer and a second sub-layer on the driver backplane. The surface of the second sub-layer away from the first sub-layer is the reflective surface. The formation of the first sub-layer includes steps S01 to S03.

At step S01, a resin material layer is coated.

At step S02, an exposure process and a development process are performed on the resin material layer by using a mask plate with a first light-transmitting pattern to form a plurality of first patterns.

Figure 13:
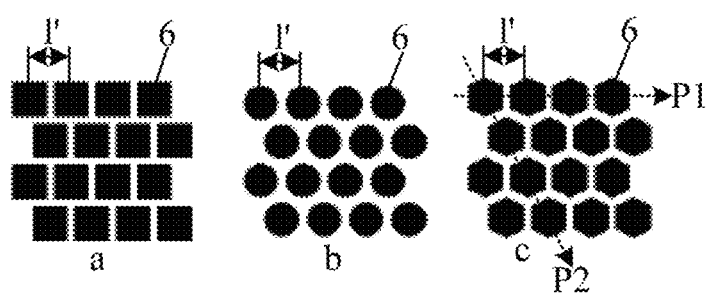
FIG. 13 is a schematic top view showing arrangements of a first pattern in a shape of a square, a circle, and a regular hexagon according to an embodiment of the present disclosure.
Figure 14:
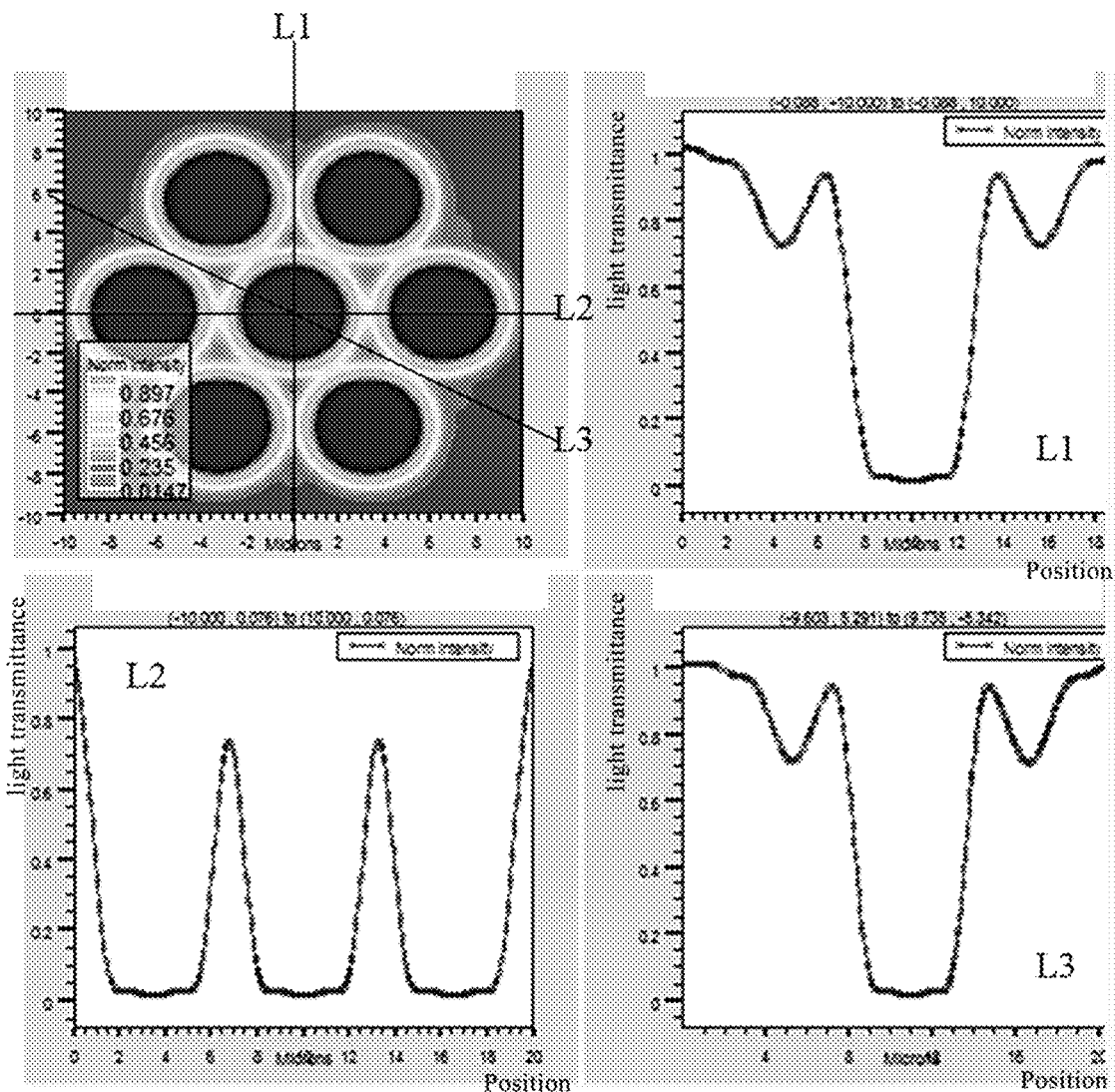
FIG. 14 is a graph showing light transmittances for exposure light along three different directions when the first pattern in FIG. 13 is formed according to an embodiment of the present disclosure.

The resin material layer is made of a positive material. A part of the resin material layer corresponding to the first light-transmitting pattern of the mask plate is removed after the exposure and development processes, and the other part of the transparent resin material layer corresponding to regions of the mask plate except the first light-transmitting pattern is retained to form the first patterns each of which is a rudiment of the arc surface. As shown in FIG. 13 (a, b, c), each of the first patterns 6 has a shape of a square, a circle, a regular hexagon, or a regular octagon. The plurality of first patterns 6 are the same in size and shape, and the first patterns 6 are arranged in an array. The plurality of first patterns 6 are continuously arranged along any two different directions, i.e., a first straight-line direction P1 and a second straight-line direction P2. A pitch between the centers of any two adjacent first patterns 6 along each of the first straight-line direction P1 and the second straight-line direction P2 is a second distance 1', and the centers of the any two adjacent first patterns 6 along the first straight-line direction P1 are spaced apart from each other or staggered from each other by ¼ to ⅔ of the second distance 1' along the second straight-line direction P2. In a case where the first patterns 6 are arranged by the exposure process as shown in FIG. 13, transmittance curves of the exposure light along the first straight-line direction L1, the second straight-line direction L2 and the third straight-line direction L3 are as shown in FIG. 14. No high transmittance platform of the exposure light appears along the first straight-line direction L1, the second straight-line direction L2, and the third straight-line direction L3, therefore continuous compact arrangement of the arc surfaces formed subsequently can be realized, a good Lambertian-like reflective structure can be formed, and the viewing angle range, the brightness uniformity and the contrast ratio of the display panel adopting the display substrate can be further improved.

Figure 15:
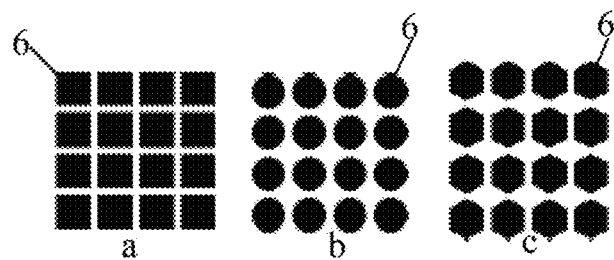
FIG. 15 is a schematic top view showing another arrangement of the first pattern having a shape of a square, a circular, or a regular hexagonal according to an embodiment of the present disclosure.
Figure 16:
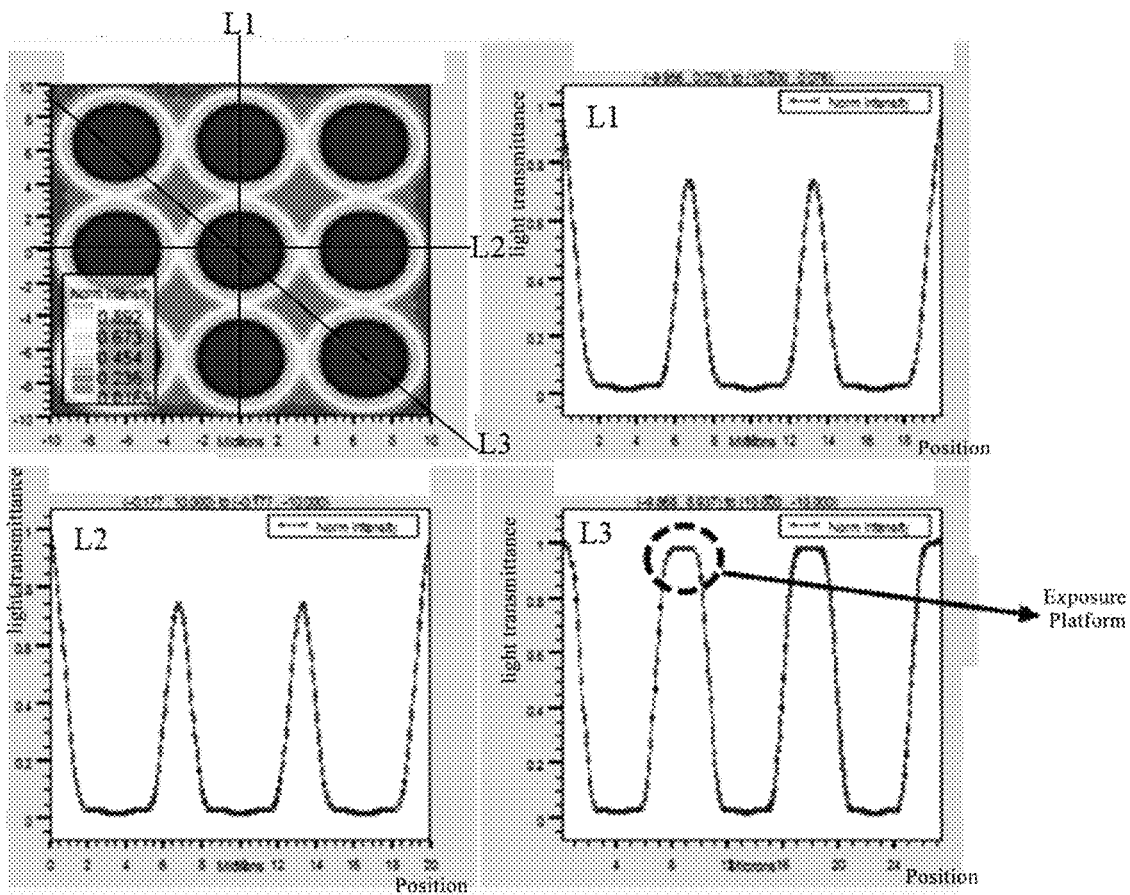
FIG. 16 is a graph showing light transmittances for exposure light along three different directions when the first pattern in FIG. 15 is formed according to an embodiment of the present disclosure.

As shown in FIG. 15 (*a*, *b*, and *c*), along the row direction of the array, any two adjacent rows of the first patterns 6 may also be respectively aligned in a one-to-one correspondence manner; and along the column direction of the array, any two adjacent columns of the first patterns 6 may also be respectively aligned in a one-to-one correspondence manner. In a case where the first patterns 6 are arranged by the exposure process as shown in FIG. 15, transmittance curves of the exposure light along the first straight-line direction L1, the second straight-line direction L2 and the third straight-line direction L3 are as shown in FIG. 16. A high transmittance platform of the exposure light appears along the third straight-line direction L3, which is not conducive to realizing the continuous compact arrangement of the arc surfaces formed subsequently. Although the arc surfaces formed subsequently based on the first patterns 6 in FIG. 15 are less continuous than the situation that the first patterns 6 are arranged in a staggered manner, a Lambertian-like reflective structure can be formed to a certain extent, therefore the viewing angle, the brightness uniformity and the contrast ratio of the display panel adopting the display substrate can be improved.

In FIG. 14 and FIG. 16, the first patterns 6 are disposed in an array in a planar coordinate system formed by a transverse X-axis and a longitudinal Y-axis. A row direction of the array formed by the first patterns 6 is the X-axis direction, and a column direction of the array formed by the first patterns 6 is the Y-axis direction. The first straight-line direction L1 is the column direction of the array formed by the first patterns 6, the second straight-line direction L2 is the row direction of the array formed by the first patterns 6, and the third straight-line direction L3 is a diagonal direction of the array formed by the first patterns 6. The diagonal direction is a diagonal direction of the square formed by arranging the first patterns 6 or a direction of a symmetry axis direction, between the row direction and the column direction of the array formed by the first patterns 6, of the regular hexagon formed by arranging the first patterns 6. The transmittance platform represents light transmittance of exposure light passing through the first light-transmitting pattern of the mask plate (i.e., other regions except for the regions on the mask plate for forming the first patterns 6). The high transmittance platform represents that exposure light passing through the first light-transmitting pattern of the mask plate has a high light transmittance. Since each of the gaps (corresponding to the first light-transmitting pattern of the mask plate), arranged along the first straight-line direction L1, the second straight-line direction L2 and the third straight-line direction L3, between any two first patterns 6 arranged in a staggered manner in FIG. 14 is small, the high-transmittance platform of the exposure light cannot be formed for the first patterns 6 arranged in a staggered manner in FIG. 14, and thus continuous compact arrangement of the arc surfaces formed subsequently can be realized, and a good Lambertian-like reflective structure can be formed. However, since each of the gaps (corresponding to the first light-transmitting pattern of the mask plate), arranged along the third straight-line direction L3, between any two first patterns 6 arranged in an aligned manner in FIG. 16 is greater, a high-transmittance platform of the exposure light can be formed along the third straight-line direction L3 for the first patterns 6 arranged in an aligned manner in FIG. 16, and the subsequently formed arc surfaces are less continuous than the arrangement of the first patterns 6 in FIG. 14.

It should be noted that the first via-hole and the first patterns may be formed through the a single patterning process. For example, by providing a second light-transmitting pattern in the same mask plate with the first light-transmitting pattern, a part of the transparent resin material layer corresponding to the second light-transmitting pattern of the mask plate is removed after exposure and development processes are performed on the transparent resin material layer, so as to form a pattern of the first via-hole. Alternatively, after the first patterns are formed, a pattern of the first via-hole can also be formed by providing a second light-transmitting pattern in another mask plate, and a part of the material corresponding to the second light-transmitting pattern of another mask plate is removed after exposure and development processes are performed on the material.

Optionally, when the transparent resin material layer is exposed, the light transmittance of the exposure light passing through the first light-transmitting pattern of the mask plate is in a range of 40% to 60%. The intensity simulation of the exposure light show that the smaller the first light-transmitting pattern is, the smaller the gray scale of the exposure light can be realized. The continuous compact arc surfaces can be formed by keeping the light transmittance of the exposure light in a range of 40% to 60%.

At step S03, a reflow process is performed on the first patterns at a temperature of 230° C. to 250° C. to form the arc surfaces.

The first patterns are protruding structures with clear edges and corners, and upper surfaces of the first patterns are flat surfaces. The protruding structures can be melted at the temperature of 230° C. to 250° C. and flow into grooves between the protruding structures under the action of gravity, so that the upper surfaces of the protruding structures with the clear edges and corners form the arc surfaces.

The formation of the second sub-layer includes: depositing a reflective metal layer on the first sub-layer. The formed reflective metal layer matches a surface of the first sub-layer in contact with the reflective metal layer in size and shape.

The display substrate is provided with the reflective structure in which the arc surfaces are arranged continuously as the reflective surface, the reflective structure can enable the light intensity distribution curve of the light reflected when the incident light with various incident angles is incident on the reflective surface to be proximal to a cosine function. That is, the distribution curve of the light intensity of the light reflected when the incident light with various incident angles is incident on the reflective surface presents a normal distribution, which is substantially consistent with the Lambertian reflective curve, so that the reflective structure 3 can be formed as the Lambertian-like reflective structure, which can realize that the light intensity of the diffused light along various directions is always proportional to the cosine function of the incident angle regardless of the direction of the incident light, so that the light from various directions has the same luminance, and thus not only the brightness uniformity and the contrast ratio of the display panel including the display substrate can be improved, but also the viewing angle of display panel including the display substrate can be improved, and thus the display effect of display panel including the display substrate can be improved.

An embodiment of the present disclosure further provides a display panel, which includes the display substrate in any one of the above embodiments. The display panel further includes a counter substrate facing the display substrate, with a liquid crystal layer disposed between the display substrate and the counter substrate.

In the display substrate in any one of above-mentioned embodiments, not only the brightness uniformity and the contrast ratio of the display panel can be improved, but also the viewing angle of the display panel can be enlarged, and moreover the display effect of the display panel can be improved.

An embodiment of the present disclosure further provides a display module, which includes the display panel in any one of above embodiments and a light source. The light source is disposed on the light-emitting side of the display panel, and the light-emitting surface of the light source faces the light-emitting side of the display panel.

The light source includes micro light-emitting diodes (Micro-LEDs) arranged in an array.

In the display panel in any one of above-mentioned embodiments, not only the brightness uniformity and the contrast ratio of the display module can be improved, but also the viewing angle of the display module can be enlarged, and moreover the display effect of the display module can be improved.

The display module provided by the embodiments of the present disclosure can be any product or component with a display function, such as an LCD panel, an LCD television, a display, a mobile phone, a navigator and the like.

It will be understood that the above embodiments are merely exemplary embodiments for illustrating the principles of the present disclosure, and the present disclosure is not limited thereto. It will be apparent to those skilled in the art that various changes and modifications can be made therein without departing from the spirit and scope of the present disclosure, and these changes and modifications are within the scope of the present disclosure.

What is claimed is:

1. A display substrate comprising a driver backplane, and a reflective structure and a pixel electrode on the driver backplane, wherein
the reflective structure and the pixel electrode are sequentially disposed on the driver backplane along a thickness direction away from the driver backplane,
the pixel electrode is connected to the driver backplane through the reflective structure, and
a surface of the reflective structure away from the driver backplane is a reflective surface comprising a plurality of arc surfaces, and each of the plurality of arc surfaces is convex protruding towards a direction away from the driver backplane, the plurality of the arc surfaces have a same size and are continuously arranged, and any two adjacent arc surfaces of the plurality of the arc surfaces are connected to each other,
an orthographic projection of each of the plurality of arc surfaces on the base substrate has a shape of a circle,
in orthogonal projections of the plurality of arc surfaces on the driver backplane, a line connecting centers of any three circles directly adjacent to each other forms one of following patterns: an equilateral triangle and an isosceles right triangle,
each of the plurality of arc surfaces comprises: a first sub-portion and a second bus-portion surrounding the first sub-portion and connected to the first sub-portion, the first sub-portion is a portion of a spherical surface, a vertex of the first sub-portion is a vertex of the arc surface, the second sub-portions of any two adjacent arc surfaces are connected to each other, and a proportion of the pitch between the vertexes of the first sub-portions of the two adjacent arc surfaces to a curvature radius of the first sub-portion is: 14.1:1.

2. The display substrate of claim 1, wherein the second sub-portions of any two adjacent arc surfaces are spliced to form a concave arc surface protruding along a direction opposite to a convex direction of the first sub-portion.

3. The display substrate of claim 1, wherein the plurality of arc surfaces are arranged in an array.

4. The display substrate of claim 1, wherein
the plurality of arc surfaces are continuously arranged along first and second straight-line directions different from each other, and
the vertexes of any two adjacent arc surfaces along the first straight-line direction are staggered along the second straight-line direction from each other by ¼ to ⅔ of a first distance, the first distance being a pitch between vertexes of any two adjacent arc surfaces along the first and second straight-line directions.

5. The display substrate of claim 1, wherein the pitch between the vertexes of the first sub-portions of any two adjacent arc surfaces is greater than 0 μm and less than or equal to 10 μm.

6. The display substrate of claim 1, wherein
the reflective structure comprises a first sub-layer and a second sub-layer stacked sequentially in a direction away from the driver backplane, and
a surface of the second sub-layer away from the first sub-layer is the reflective surface, and a surface of the first sub-layer in contact with the second sub-layer matches the second sub-layer in size and shape.

7. The display substrate of claim 6, wherein
the first sub-layer is made of a resin material, and
the second sub-layer is made of a reflective metal material.

8. The display substrate of claim 1, wherein
the driver backplane comprises a base substrate and a transistor on a side of the base substrate proximal to the reflective structure; the transistor comprises a gate electrode, an active layer, a first electrode and a second electrode; and a first via-hole is in the reflective structure,
the display substrate further comprises a planarization layer on a side of the reflective structure away from the driver backplane, and the planarization layer is on a side of the pixel electrode proximal to the driver backplane, a surface of the planarization layer away from the driver backplane is a planarized surface, and
a second via-hole is in the planarization layer, an orthographic projection of the second via-hole on the base substrate is spaced apart from an orthographic projection of the first via-hole on the base substrate, and the pixel electrode is connected to the second electrode through both of the second via-hole and the reflective structure.

9. The display substrate of claim 6, comprising a plurality of pixel electrodes arranged in an array, wherein
the second sub-layer comprises a plurality of sub-portions independent of each other and in one-to-one correspondence with the plurality of pixel electrodes, and
both of orthographic projections of the first via-hole and the second via-hole on the base substrate are within an orthographic projection of a corresponding one of the plurality of pixel electrodes on the base substrate.

10. The display substrate of claim 9, wherein
each of the plurality of sub-portions comprises a first region and a second region independent of each other, and both of the orthographic projections of the first via-hole and the second via-hole on the base substrate are within an orthographic projection of a corresponding first region on the base substrate.

11. The display substrate of claim 8, further comprising a plurality of gate lines, a plurality of data lines, and a plurality of storage electrodes, wherein
the plurality of gate lines are in the same layer as the gate electrode and each of the plurality of gate lines is connected to a corresponding gate electrode,
the plurality of data lines are in the same layer as the first electrode, and each of the plurality of data lines is connected to a corresponding first electrode, and
each of the plurality of storage electrodes comprises a first electrode plate and a second electrode plate facing the first electrode plate, the first electrode plate is in the same layer as the first electrode, and the second electrode plate is in the same layer as the gate electrode.

12. The display substrate of claim 11, wherein
each column of pixel electrodes correspond to n data lines of the plurality of data lines, n is a positive integer more than or equal to 2, and
each pixel electrode of each column of pixel electrodes corresponds to different gate lines.

13. A display panel, comprising the display substrate according to claim 1 and a counter substrate aligned with the display substrate to form a cell, with a liquid crystal layer between the display substrate and the counter substrate.

14. A display module, comprising the display panel according to claim 13 and a light source on a light-emitting side of the display panel, wherein a light-emitting surface of the light source faces the light-emitting side of the display panel.

15. A method for manufacturing a display substrate, comprising:
forming a driver backplane; and
sequentially forming a reflective structure and a pixel electrode on the driver backplane, such that the reflective structure and the pixel electrode are sequentially disposed on the driver backplane along a thickness direction away from the driver backplane and the pixel electrode is connected to the driver backplane through the reflective structure,
wherein forming the reflective structure comprises forming a reflective surface, and
wherein forming the reflective surface comprises forming a plurality of arcs surfaces protruding along a direction away from the driving backplane, such that:
the plurality of arc surfaces have a same size and are continuously arranged,
any two adjacent arc surfaces of the plurality of arc surfaces are connected to each other,
an orthographic projection of each of the plurality of arc surfaces on the base substrate has a shape of a circle,
in orthogonal projections of the plurality of arc surfaces on the driver backplane, a line connecting centers of any three circles directly adjacent to each other forms one of following patterns: an equilateral triangle and an isosceles right triangle,
each of the plurality of arc surfaces comprises: a first sub-portion and a second bus-portion surrounding the first sub-portion and connected to the first sub-portion, the first sub-portion is a portion of a spherical surface, a vertex of the first sub-portion is a vertex of the arc surface, the second sub-portions of any two adjacent arc surfaces are connected to each other, and a proportion of the pitch between the vertexes of the first sub-portions of the two adjacent arc surfaces to a curvature radius of the first sub-portion is: 14.1:1.

16. The method of claim 15, wherein
forming the reflective structure comprises: sequentially forming a first sub-layer and a second sub-layer on the driver backplane, with a surface of the second sub-layer away from the first sub-layer serving as the reflective surface, and
forming the first sub-layer comprises:
coating a resin material layer;
respectively forming a first pattern and a pattern of a first via-hole by performing exposure and development processes on the resin material layer by using a mask plate with a first light-transmitting pattern and a second light-transmitting pattern, and
reflowing the first pattern at a temperature of 230° C. to 250° C. to form the plurality of arc surfaces, and
forming the second sub-layer comprises: depositing a reflective metal layer on the first sub-layer.

17. The method of claim 16, wherein the first pattern has a shape of a square, a circle, a regular hexagon, or a regular octagon.

* * * * *